United States Patent [19]
Lee et al.

[11] Patent Number: 5,559,052
[45] Date of Patent: Sep. 24, 1996

[54] INTEGRATED CIRCUIT FABRICATION WITH INTERLEVEL DIELECTRIC

[75] Inventors: Kuo-Hua Lee; Chen-Hua D. Yu, both of Orlando, Fla.

[73] Assignee: Lucent Technologies Inc., Murray Hill, N.J.

[21] Appl. No.: 366,192

[22] Filed: Dec. 29, 1994

[51] Int. Cl.$^6$ ................................................. H01L 21/31
[52] U.S. Cl. ........................ 437/52; 437/195; 437/240; 437/978
[58] Field of Search ........................ 437/52, 195, 240, 437/978

[56] References Cited

U.S. PATENT DOCUMENTS 4,589,928  5/1986  Dalton et al. .
4,731,346  3/1988  Ashwell ........................ 437/240

FOREIGN PATENT DOCUMENTS

| | | | |
|---|---|---|---|
| 55-55538 | 4/1980 | Japan | 437/240 |
| 56-32732 | 4/1981 | Japan | 437/240 |
| 57-28335 | 2/1982 | Japan | 437/240 |
| 57-56221 | 11/1982 | Japan | 437/240 |
| 60-74550 | 4/1985 | Japan | 437/240 |
| 61-95533 | 5/1986 | Japan | 437/240 |

*Primary Examiner*—T. N. Quach
*Attorney, Agent, or Firm*—John T. Rehberg

[57] ABSTRACT

An interlevel dielectric comprised of phosphorus-doped glass surrounding the second polysilicon level of an SRAM cell is disclosed. The second polysilicon is generally a cell local interconnect. The phosphorus-doped glass layer efficiently getters sodium from underlying layers. The phosphorus-doped glass layer is utilized although another doped gettering layer may be used at a higher level of the circuit.

9 Claims, 1 Drawing Sheet

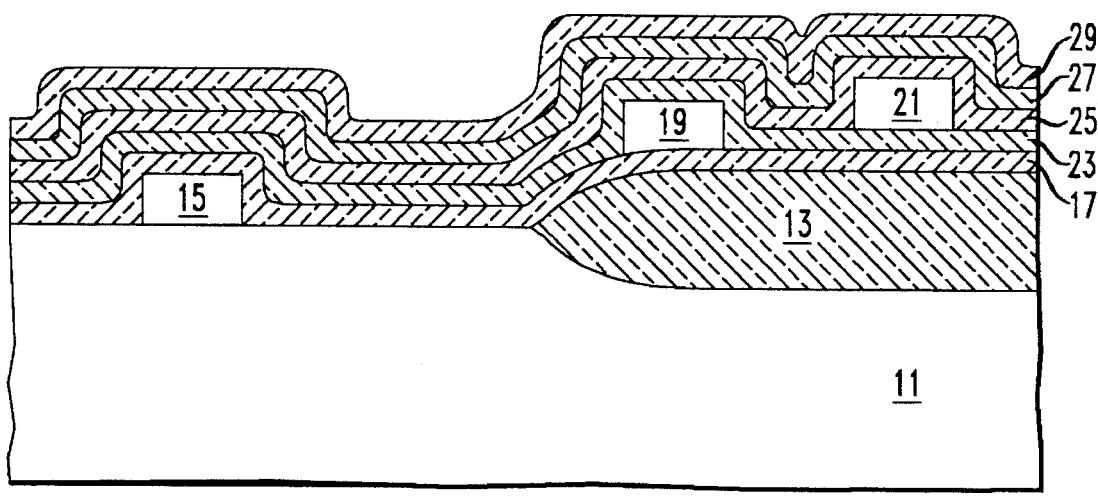

5,559,052

INTEGRATED CIRCUIT FABRICATION WITH INTERLEVEL DIELECTRIC

TECHNICAL FIELD

This invention relates to integrated circuits and methods for their fabrication.

BACKGROUND OF THE INVENTION

Many static random access memories (SRAMS) utilize polysilicon load resistors. In other words, each basic SRAM cell contains two access transistors, two pull-down transistors, and two polysilicon load resistors. Such SRAM cells typically contain at least two, usually three levels of polysilicon runners.

Those concerned with SRAM development have noticed that mobile charge in the vicinity of the polysilicon resistor tends to degrade cell performance. Attempts to solve the problem have included the placement of layers made from doped TEOS (i.e., in BPTEOS) at a substantially upper level i.e., near the third polysilicon level of the integrated circuit. However, experiments have shown that the problem has still not been solved.

Another dielectric material sometimes utilized as a sodium getter is phosphorus-doped glass or p-glass. Phosphorus-doped glass has been occasionally utilized in integrated circuits which use aluminum metallization. Typically, the phosphorus-doped glass is either: (a) not heated after formation, or (b) heated to a high temperature such as 900° to 1000° C. to cause flow after formation.

Those concerned with the development of integrated circuits, particularly SRAMS, or other devices with multiple levels of patterned conductors have continued to search for structures and methods to alleviate mobile ion contamination.

SUMMARY OF THE INVENTION

Illustratively, the present invention includes
forming a gate upon a substrate;
forming a first dielectric layer over the gate;
forming a first patterned conductor upon the first dielectric;
forming a second doped dielectric layer over the patterned conductor and over the first dielectric;
heating the second doped dielectric to attract sodium ions;
forming a second patterned conductor over the second doped dielectric; and
forming a third doped dielectric overlying the second patterned conductor, said third doped dielectric being capable of gettering sodium ions.

In another embodiment, the invention illustratively includes an integrated circuit having a gate upon a substrate. A first dielectric is over the gate and substrate. A first patterned conductor is upon the first dielectric. A second doped dielectric is over the first patterned conductor and over the first dielectric. A second patterned conductor overlies the second doped dielectric, and a third doped dielectric overlies the second patterned conductor.

BRIEF DESCRIPTION OF THE DRAWINGS

The FIGURE is a cross-sectional view of an integrated circuit useful in understanding an illustrative embodiment of the present invention.

DETAILED DESCRIPTION

In the FIGURE, reference numeral 11 denotes a substrate which may typically, be a silicon, doped silicon, epitaxial silicon, etc. In general, the term substrate is used to refer to a body of material upon which other layers of material may be deposited or formed. Reference numeral 13 denotes a field oxide. Reference numeral 15 denotes a polysilicon conductor. Conductor 15 may typically, be a polysilicon gate (although the gate oxide and the source and drain regions have not been depicted for simplicity). Reference numeral 17 denotes a layer of dielectric, typically silicon dioxide made from the decomposition of TEOS. Layer 17 is undoped and helps to prevent the inadvertent, undesirable doping of source or drain regions by dopants in overlying layers. Reference numeral 19 denotes a patterned polysilicon layer. Typically, reference numeral 19 denotes a polysilicon conductor (typically a local interconnection for the SRAM cell). Either or both of gate 15 and conductor 19 may have a silicide, such as titanium silicide formed on their upper surface. Reference numeral 23 denotes a layer of phosphorus-doped glass, also termed p-glass which is deposited over and surrounding conductor 19. Layer 23 may be made from LPCVD of silane and 400° C. or below. An alternative material may be made from plasma enhanced p-doped TEOS (PE-PTEOS) formed at low temperatures. After p-glass layer 23 has been formed, it is annealed at a low temperature, typically between 800° and 850° C. The annealing step causes the mobile ions to move to the p-glass. The low temperature anneal also avoids damage to underlying silicides.

P-glass layer 23 which covers and surrounds conductor 19 helps to getter sodium which may be present in conductor 19 as well as lower layers, such as field oxide 13, or layer 17 or gate 15. The presence of layer 23 ensures that sodium present in underlying layers is adequately trapped. Conductor 21, typically made from polysilicon, is formed atop layer 23. However, at least a portion of runner 21 has a somewhat high resistivity, specifically tailored for the SRAM function. In other words, the SRAM load resistor is contained within conductor 21. Methods for depositing and subsequently patterning and tailoring the resistivity of layer 21 are well-known in the art. Layer 25 is an undoped dielectric, desirably made from TEOS, or plasma enhanced TEOS. Layer 27 is a doped dielectric layer, such as dielectric layer made from boron-phosphorus doped TEOS (BPTEOS). Layer 27 also functions as a sodium gettering layer. However, applicants have found that layer 27, being somewhat removed from substrate 11 and field oxide 13, does not getter sodium very efficiently. Consequently, the presence of p-glass layer 23 is highly desirable. Layer 29 is an undoped dielectric, such as silicon dioxide made by the decomposition of TEOS.

The invention is particularly useful in SRAM or other devices which utilize three levels of polysilicon (although the invention is not so limited). Typically, three-level polysilicon processing requires additional photoresist layers and etching, composed to other device fabrication processing. The additional processing required for SRAM applications generates more sodium and layer 23 is useful in trapping the sodium.

Conventional SRAM processing may be performed at this point, including formation of one or more layers of metal conductors overlying layer 29.

We claim:
1. A method of integrated circuit fabrication comprising;
forming a gate upon a substrate;
forming a first dielectric layer over said gate;

forming a first patterned conductor upon said first dielectric;

forming a second doped dielectric over said patterned conductor and over said first dielectric;

heating said second doped dielectric to attract sodium ions;

forming a second patterned conductor over said second doped dielectric; and forming a third doped dielectric overlying said second patterned conductor, said third doped dielectric being capable of gettering sodium ions.

2. The method of claim 1 in which a fourth undoped dielectric is formed between said second patterned conductor and said third doped dielectric.

3. The method of claim 1 in which a fifth undoped dielectric is formed over said third doped dielectric.

4. The method of claim 3 in which at least one level of metallization is formed over said fifth undoped dielectric.

5. The method of claim 1 in which said integrated circuit includes an SRAM.

6. The method of claim 1 in which said second doped dielectric is made from a material chosen from the group consisting of p-glass and PE-PTEOS.

7. The method of claim 1 in which said second doped dielectric is heated to a temperature between 800° and 850° C.

8. The method of claim 1 in which said gate and said first and second patterned conductors are formed from polysilicon.

9. The method of claim 8 in which at least one of said conductors has an overlying silicide.

\* \* \* \* \*